US009960592B2

United States Patent
Liu et al.

(10) Patent No.: US 9,960,592 B2
(45) Date of Patent: May 1, 2018

(54) SHORT-CIRCUIT DETECTION DEVICE AND METHOD USED IN INVERTER CIRCUIT

(71) Applicant: Delta Electronics (Shanghai) Co., Ltd., Shanghai (CN)

(72) Inventors: Liang Liu, Shanghai (CN); Bo-Yu Pu, Shanghai (CN); Yi Zhang, Shanghai (CN); Hong-Jian Gan, Shanghai (CN); Jian-Ping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 450 days.

(21) Appl. No.: 14/711,762

(22) Filed: May 13, 2015

(65) Prior Publication Data

US 2015/0349521 A1 Dec. 3, 2015

(30) Foreign Application Priority Data

May 30, 2014 (CN) .......................... 2014 1 0241037

(51) Int. Cl.
*H02H 7/122* (2006.01)
*G01R 31/25* (2006.01)
(Continued)

(52) U.S. Cl.
CPC ......... *H02H 7/1225* (2013.01); *G01R 31/025* (2013.01); *G01R 31/42* (2013.01);
(Continued)

(58) Field of Classification Search
CPC ....... G01R 31/025; G01R 31/42; H02M 1/12; H02M 1/32; H02M 1/38; H02H 7/122; H02H 7/1225; H02H 3/08; H02H 9/02
See application file for complete search history.

(56) References Cited

U.S. PATENT DOCUMENTS 5,933,341 A * 8/1999 Kuriyama ......... H02M 7/53803
361/18
6,369,543 B1 * 4/2002 Masselus ............. H02H 7/1225
318/700
(Continued)

FOREIGN PATENT DOCUMENTS

CN 101382585 A 3/2009
CN 101793938 A 8/2010
(Continued)

*Primary Examiner* — Thienvu Tran
*Assistant Examiner* — Christopher Clark
(74) *Attorney, Agent, or Firm* — CKC & Partners Co., Ltd.

(57) ABSTRACT

A method for detecting a short circuit fault in a multi-level inverter circuit is provided. The multi-level inverter circuit includes a plurality of single phase branches each including of switches. The method includes steps outlined below. At least one detecting pulse sequence is transmitted to the switches of each of the single phase branches. Whether a conducting path is formed in any of the single phase branches is determined according to the detecting pulse sequence. When the conducting loop is formed, respective position of one or more malfunctioned switch in the single phase branches is located according to a path of the conducting loop. A short-circuit detection device and a three-phase three-level inverter circuit are also disclosed herein.

24 Claims, 7 Drawing Sheets

(51) Int. Cl.
   *G01R 31/42* (2006.01)
   *H02M 1/32* (2007.01)
   *H02H 9/02* (2006.01)
   *G01R 31/02* (2006.01)
   *H02M 7/487* (2007.01)
   *H02H 1/00* (2006.01)

(52) U.S. Cl.
   CPC ............... *H02H 9/02* (2013.01); *H02M 1/32* (2013.01); *H02M 7/487* (2013.01); *H02H 1/0007* (2013.01)

(56) References Cited

U.S. PATENT DOCUMENTS

| | | | | |
|---|---|---|---|---|
| 8,472,153 | B1* | 6/2013 | Grbovic | H02H 7/1216 361/101 |
| 8,633,664 | B2* | 1/2014 | Endoh | B62D 5/0487 318/400.21 |
| 9,294,010 | B2* | 3/2016 | Viitanen | H02M 7/797 |
| 2005/0127853 | A1* | 6/2005 | Su | H02M 7/487 318/108 |
| 2005/0281065 | A1* | 12/2005 | Nojima | H02H 7/1227 363/98 |
| 2006/0245222 | A1* | 11/2006 | Nojima | H02M 1/32 363/132 |
| 2007/0159749 | A1* | 7/2007 | Oka | H02M 7/487 361/93.1 |
| 2008/0204959 | A1* | 8/2008 | Knapp | H02H 7/1225 361/100 |
| 2009/0308683 | A1* | 12/2009 | Suzuki | B62D 5/0463 180/446 |
| 2010/0036555 | A1* | 2/2010 | Hosoda | B60L 3/003 701/22 |
| 2011/0156626 | A1* | 6/2011 | Mukai | B62D 5/0487 318/400.21 |
| 2011/0280049 | A1 | 11/2011 | Mori et al. | |
| 2012/0212064 | A1 | 8/2012 | Spanoche et al. | |
| 2013/0320903 | A1* | 12/2013 | Aalund | G01R 31/343 318/490 |
| 2014/0104911 | A1* | 4/2014 | Wu | H02M 7/537 363/131 |
| 2014/0369088 | A1* | 12/2014 | Yoo | H02M 5/458 363/37 |
| 2015/0256116 | A1* | 9/2015 | Tateda | B60L 3/0061 318/504 |
| 2017/0099013 | A1* | 4/2017 | Martini | H02M 7/487 |

FOREIGN PATENT DOCUMENTS

| | | |
|---|---|---|
| CN | 102012471 A | 4/2011 |
| CN | 102097970 A | 6/2011 |
| CN | 102396144 A | 3/2012 |
| CN | 102830263 A | 12/2012 |
| CN | 103207339 A | 7/2013 |
| TW | 188892 | 8/1992 |
| TW | I398657 B1 | 6/2013 |

* cited by examiner

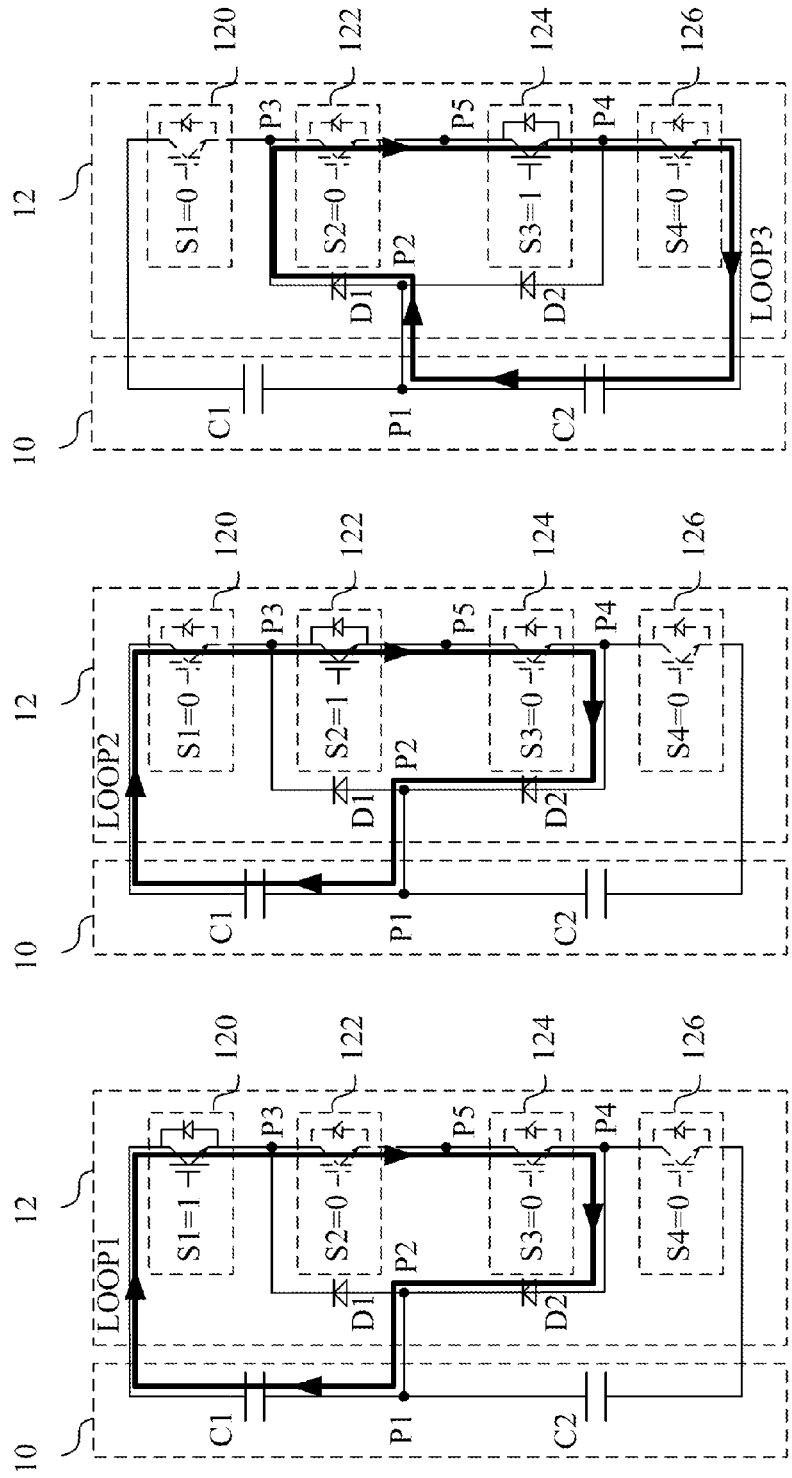

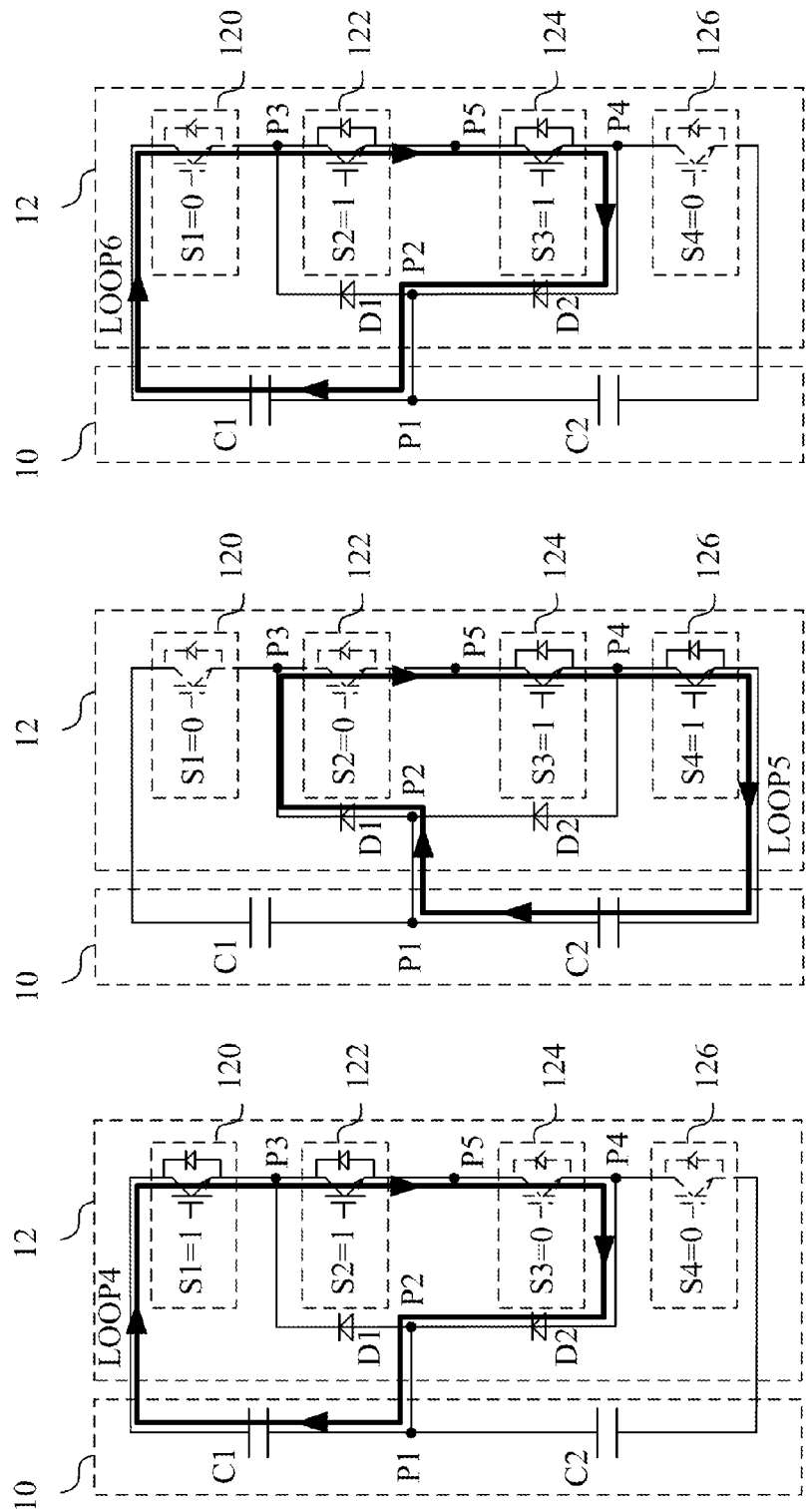

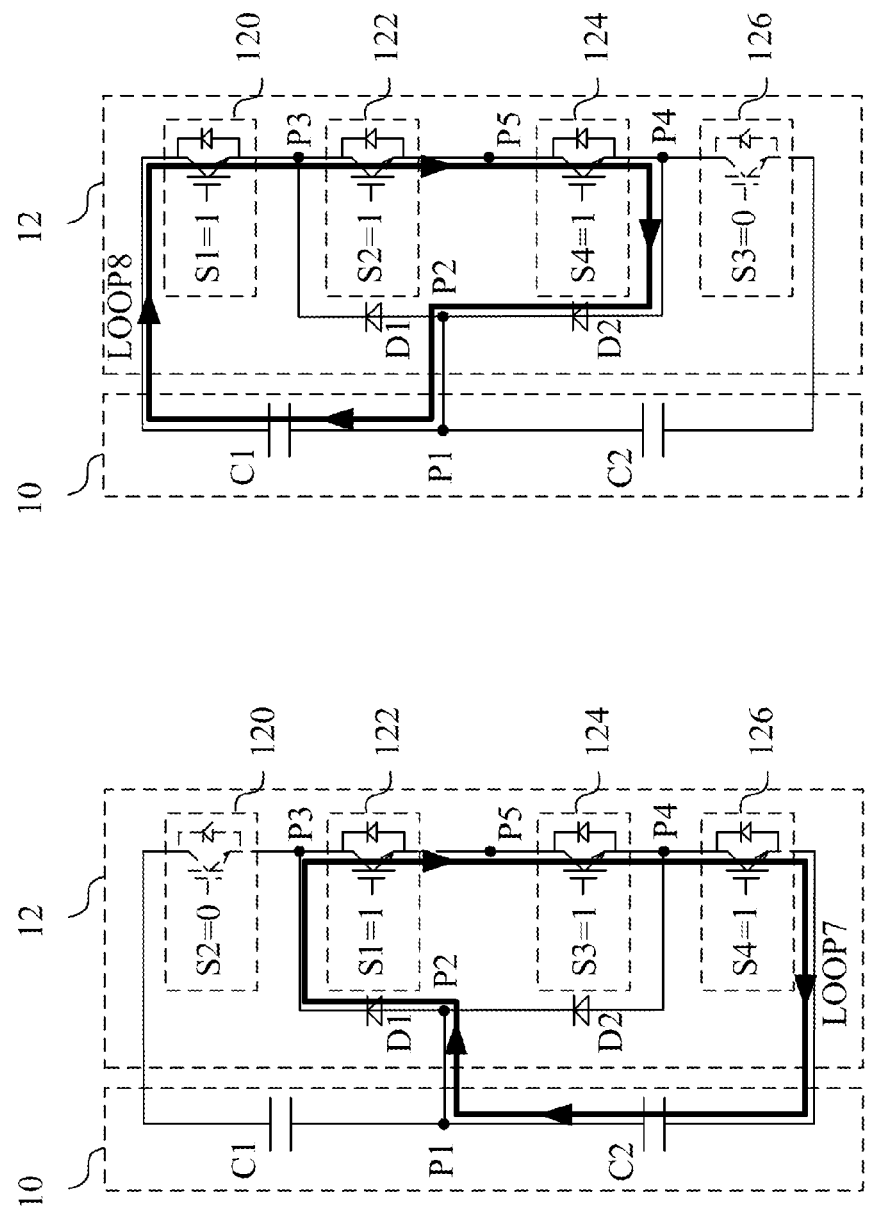

US 9,960,592 B2

SHORT-CIRCUIT DETECTION DEVICE AND METHOD USED IN INVERTER CIRCUIT

RELATED APPLICATIONS

This application claims priority to Chinese Application Serial Number 201410241037.3, filed May 30, 2014, which is herein incorporated by reference.

BACKGROUND

Field of Invention

The present disclosure relates to an inverter technology. More particularly, the present disclosure relates to a short-circuit detection device and method used in an inverter circuit.

Description of Related Art

Inverters are commonly utilized in power systems and users have higher and higher expectations to the maintainability. Taking a multi-level inverter as an example, the multi-level inverter is especially useful in applications requiring high voltage and high power. However, the structure and the control mechanism of the circuit become more complicated as the level of the inverter circuit increases result in a higher probability of the failure of the power device. The system reliability is significantly decreased.

Common conditions that cause failures, such as the existence of an open-circuited switch, a short-circuited switch, an incorrect wiring connection, a wiring disconnection or a unsuccessful driving condition, will damage the components or the system. If there is no efficient way to determine that whether there is a short-circuited condition in the inverter circuit, the inverter circuit is very likely to be damaged during its operation and may do harm to, for instance, production delays or serious and catastrophic incidents.

Therefore, an appropriate solution of a short-circuit detection device and method used in an inverter circuit has yet been developed, in order to address the above problems.

SUMMARY

The present disclosure provides a method for detecting a short circuit fault in a multi-level inverter circuit. The inverter circuit includes a plurality of single phase branches, each of which includes a plurality of switches. The short-circuit detection method includes transmitting at least a detection pulse sequence to the plurality of switches of the single phase branch; determining whether a conducting loop is formed in the single phase branch according to the detection pulse sequence; and determining a position of a malfunctioned switch of the single phase branch according to a path of the conducting loop when the conducting loop exists.

An aspect of the present disclosure provides a short-circuit detection device for a multi-level inverter circuit. The inverter circuit includes a plurality of single phase branches, wherein each of the plurality of single phase branches includes a plurality of switches. The short-circuit detection device includes a pulse transmitting module, a loop determining module and a fault detection module. The pulse transmitting module transmits at least one detection pulse sequence to the plurality of switches of the single phase branch. The loop determining module determines whether a conducting loop is formed in the single phase branch according to the detection pulse sequence. The fault detection module determines a position of a malfunctioned switch of the single phase branch according to a path of the conducting loop when the conducting loop exists.

An aspect of the present disclosure provides a three-phase three-level inverter circuit. The three-phase three-level inverter circuit includes a capacitor module, three single phase branches and a fault detection module. The capacitor module includes a first capacitor and a second capacitor, which are electrically coupled in series via a first node. Each single phase branch is coupled to the capacitor module in parallel. Each single phase branch includes a first diode, a second diode, a first switch, a second switch, a third switch and a fourth switch. The first diode and the second diode are electrically coupled in series between a third node and a fourth node via a second node, wherein the second node is electrically coupled to the first node. The first switch and the second switch are electrically coupled via the third node. The third switch and the fourth switch are electrically coupled via the fourth node, wherein the second switch and the third switch are electrically coupled via a fifth node. The fault detection module transmits a detection pulse sequence comprising numbers of "0" and "1" to the first switch, the second switch, the third switch and the fourth switch in the single phase branch. The fault detection module determines whether a conducting loop is formed in the single phase branch according to the detection pulse sequence, and determines a position of at least one malfunctioned switch in the single phase branches according to a path of the conducting loop when the conducting loop exists in the single phase branch.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 2A to FIG. 2C are circuit diagrams illustrating a capacitor module and a single phase branch according to an embodiment of the present disclosure.

FIG. 3A to FIG. 3C are circuit diagrams illustrating a capacitor module and a single phase branch according to another embodiment of the present disclosure.

FIG. 4A and FIG. 4B are circuit diagrams illustrating a capacitor module and a single phase branch according to yet another embodiment of the present disclosure.

DESCRIPTION OF THE EMBODIMENTS

Figure 1:
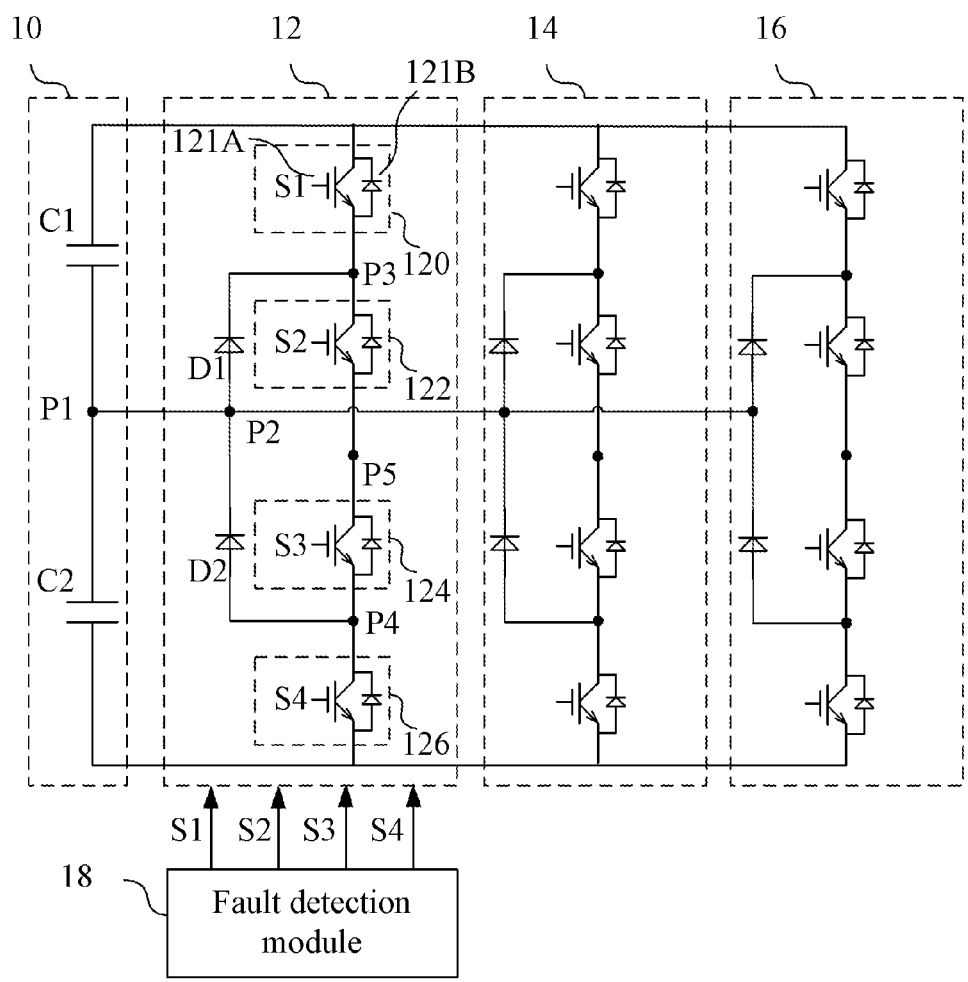
FIG. 1 is a circuit diagram illustrating an inverter circuit according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a circuit diagram illustrating an inverter circuit 1 according to an embodiment of the present disclosure. The inverter circuit 1 includes a capacitor module 10, single phase branches 12, 14 and 16, and a fault detection module 18.

The capacitor module 10 includes a first capacitor C1 and a second capacitor C2 electrically coupled in series via a first node P1. In an embodiment, the capacitor module 10 is coupled to other external circuits via a bus (not illustrated). The external circuit can be, for instance, a rectifier circuit (not illustrated), but is not limited thereto.

Each of the single phase branches 12, 14 and 16 is coupled to the capacitor module 10 in parallel. In an embodiment, the single phase branches 12, 14 and 16 have the same structure. The single phase branch 12 is utilized as an example for the descriptions below. The single phase branch 12 can be a two-level converter, a three-level converter or a five-level converter in different embodiments. The single phase branch 12 shown in FIG. 1 is realized with a three-level converter as an example, and the single phase branch 12 includes a first diode D1, a second diode D2, a first switch 120, a second switch 122, a third switch 124 and a fourth switch 126.

The first diode D1 and the second diode D2 are electrically coupled in series between a third node P3 and a fourth node P4 via a second node P2. The second node P2 is electrically coupled to the first node P1.

The first switch 120 and the second switch 122 are electrically coupled in series via the third node P3. The third switch 124 and the fourth switch 126 are electrically coupled in series via the fourth node P4. The second switch 122 and the third switch 124 are electrically coupled in series via a fifth node P5.

In an embodiment, the first switch 120, the second switch 122, the third switch 124 and the fourth switch 126 have the same structure. Taking the first switch 120 as an example, the first switch 120 includes an IGBT (Insulated Gate Bipolar Switch) 121A and a diode 121B, electrically coupled in parallel. The IGBT 121A can be turned on or off according to a voltage signal applied to a gate terminal of the IGBT 121A. The first, second, third and fourth switches 120, 122, 124 and 126 can be implemented by other structures in other embodiments, and are not limited to the present embodiment.

The fault detection module 18 can transmit detection pulse sequences to the first, second, third and fourth switches 120, 122, 124 and 126 in each of the single phase branches 12, 14, 16 respectively. The detection pulse sequence comprises a number of low level signals of "0" and high level signals of "1". In an embodiment shown in FIG. 1, an exemplary detection pulse sequence S1-S4 is transmitted to the single phase branch 12 from the fault detection module 18. The pulses S1, S2, S3 and S4 of the detection pulse sequence S1-S4 correspond to the first, second, third and fourth switches 120, 122, 124 and 126 respectively.

Taking the pulse S1 in the detection pulse sequence S1-S4 as an example, when the pulse S1 is "0" the corresponding first switch 120 is turned off, and when the pulse S1 is "1", the corresponding first switch 120 is turned on. When the switches of the single phase branch 12 function normally, the detection pulse sequence S1-S4 does not cause any conducting loops to form in the single phase branch 12.

Therefore, the fault detection module 18 determines whether there is a conducting loop formed in the single phase branch 12 according to the detection pulse sequence S1-S4 being transmitted. When a conducting loop exists in the single phase branch 12, the fault detection module 18 determines a position of a malfunctioned switch in the single phase branch 12 according to a path of the conducting loop.

Reference is now made to FIG. 2A to FIG. 2C. FIG. 2A to FIG. 2C are circuit diagrams illustrating the capacitor module 10 and the single phase branch 12 according to an embodiment of the present disclosure.

In FIG. 2A to FIG. 2C, the purpose of the detection pulse sequence transmitted by the fault detection module 18 is to turn on one of the first switch 120, the second switch 122, the third switch 124 and the fourth switch 126, while keeping the other three being turned off.

For instance, in FIG. 2A, the transmitted detection pulse sequence S1-S4 is "1000". The first switch 120 receiving a high level (i.e. "1") pulse is illustrated by solid lines, while the second switch 122, the third switch 124 and the fourth switch 126 that receives a low level (i.e. "0") pulse respectively, are illustrated by dotted lines.

When the second switch 122 and the third switch 124 function normally, the second switch 122 and the third switch 124 are turned off according to the detection pulse sequence S2, S3, and regardless of whether the fourth switch 126 functions normally or not, no conducting loop is formed between the single phase branch 12 and the capacitor module 10. However, when a conducting loop is formed between the single phase branch 12 and the capacitor module 10, it means the second switch 122 and the third switch 124 are defectively short-circuited.

As shown in FIG. 2A, the conducting loop LOOP1 includes the first switch 120, the second switch 122, the third switch 124, the capacitor C1 and the second diode D2. If the conducting loop LOOP1 is formed between the single phase branch 12 and the capacitor module 10, the second switch 122 and third switch 124 of the conducting loop LOOP1 are determined to be short-circuited, since the detection sequence is supposed to make the loop open-circuited. Hence whether the second switch 122 and the third switch 124 are short-circuited can be determined according to the detection pulse sequence S1-S4 of "1000".

In FIG. 2B, the transmitted detection pulse sequence S1-S4 is "0100". The second switch 122 that receives the high level (i.e. "1") pulse is illustrated by solid lines, while the first switch 120, the third switch 124 and the fourth switch 126 that receive a low level (i.e. "0") pulse respectively, are illustrated by dotted lines.

When the first switch 120 and the third switch 124 function normally, the first switch 120 and the third switch 124 are turned off according to the pulses S1, S3. However, when a conducting loop LOOP2 is formed between the single phase branch 12 and the capacitor module 10, it means that the first switch 120 and the third switch 124 are defectively short-circuited.

In an embodiment, the fault detection module 18 determines that whether a conducting loop is formed in the single phase branch 12 according to the above detection pulse sequence and a hardware short-circuit protection mechanism.

As shown in FIG. 2B, the conducting loop LOOP2 includes a first switch 120, a second switch 122, a third switch 124, the capacitor C1 and the second diode D2. If the conducting loop LOOP2 is formed between the single phase branch 12 and the capacitor module 10, the first switch 120 and the third switch 124 of the conducting loop LOOP2 are determined to be short-circuited, since the detection sequence is supposed to make the loop open-circuited. Hence, whether the first switch 120 and the third switch 124 are short-circuited can be determined according to the detection pulse sequence S1-S4 of "0100".

However, it is noted that when the detection pulse sequence S1-S4 is transmitted such that a conduction loop including the second switch 122, the third switch 124 and the fourth switch 126 is formed via the capacitor C2 and the first diode D1, it means that both the third switch 124 and the fourth switch 126 are defectively short-circuited.

On the other hand, when the detection pulse sequence S1-S4 is transmitted such that a conduction loop including the first switch 120, the second switch 122, the third switch 124 and the fourth switch 126 is formed, it means that the first switch 120, the third switch 124 and the fourth switch 126 are all defectively short-circuited.

In FIG. 2C, the transmitted detection pulse sequence S1-S4 is "0010". The third switch 124 that receives a high level (i.e. "1") pulse is illustrated by solid lines, while the first switch 120, the second switch 122 and the fourth switch 126 that receive a low level (i.e. "0") pulse respectively, are illustrated by dotted lines.

When the second switch 122 and the fourth switch 126 function normally, the second switch 122 and the fourth switch 126 are turned off according to the pulses S2, S4, so there are no conducting loops formed between the single phase branch 12 and the capacitor module 10. However, when a conducting loop LOOP3 is formed between the single phase branch 12 and the capacitor module 10, it means that the second switch 122 and the fourth switch 126 are defectively short-circuited.

As shown in FIG. 2C, the conducting loop LOOP3 includes a second switch 122, a third switch 124, a fourth switch 126, the capacitor C2 and the first diode D1. If the conducting loop LOOP3 is formed between the single phase branch 12 and the capacitor module 10, the second switch 122 and the fourth switch 126 of the conducting loop LOOP3 are determined to be short-circuited, since the detection sequence is supposed to make the loop open-circuited. Hence whether the second switch 122 and the fourth switch 126 are short-circuited can be determined according to the detection pulse sequence S1-S4 of "0010".

When the detection pulse sequence S1-S4 is transmitted such that a conduction loop including the first switch 120, the second switch 122 and the third switch 124, the capacitor C1 and the second diode D2 is formed, both the first switch 120 and the second switch 122 are determined to be defectively short-circuited.

On the other hand, when the detection pulse sequence S1-S4 is transmitted such that a conduction loop including the first switch 120, the second switch 122, the third switch 124 and the fourth switch 126 is formed, the first switch 120, the second switch 122 and the fourth switch 126 are all determined to be defectively short-circuited.

A detection pulse sequence S1-S4 of "0001" has the same effect as "1000" so in an embodiment, there is no need to transmit the detection pulse sequence S1-S4 of "0001".

Reference is now made to FIG. 3A to FIG. 3C. FIG. 3A to FIG. 3C are circuit diagrams illustrating the capacitor module 10 and the single phase branch 12 according to an embodiment of the present disclosure.

In FIG. 3A to FIG. 3C, the purpose of the detection pulse sequence transmitted by the fault detection module 18 is to turn on two of the first switch 120, the second switch 122, the third switch 124 and the fourth switch 126, while keeping the other two being turned off.

For instance, in FIG. 3A, the transmitted detection pulse sequence S1-S4 is "1100". Each of the first switch 120 and the second switch 122 that receives a high level (i.e. "1") pulse is illustrated by solid lines, while the third switch 124 and the fourth switch 126 that receive a low level (i.e. "0") pulse respectively, are illustrated by dotted lines.

When the third switch 124, which is next to the first switch 120 and the second switch 122, functions normally, the third switch 124 is turned off according to the pulse S3. No conducting loop is formed between the single phase branch 12 and the capacitor module 10, regardless of whether the fourth switch 126 functions normally. However, when a conducting loop LOOP4 is formed between the single phase branch 12 and the capacitor module 10, it means that the third switch 124 is defectively short-circuited.

As shown in FIG. 3A, the conducting loop LOOP4 is formed via the first switch 120, the second switch 122, the third switch 124, the capacitor C1 and the second diode D2. If the conducting loop LOOP4 is formed between the single phase branch 12 and the capacitor module 10, the third switch 124 of the conducting loop LOOP4 is determined to be short-circuited, since the detection sequence is supposed to make the loop open-circuited. Hence, whether the third switch 124 is short-circuited can be determined according to the detection pulse sequence S1-S4 of "1100".

In FIG. 3B, the transmitted detection pulse sequence S1-S4 is "0011". Each of the third switch 124 and the fourth switch 126 that receives a high level (i.e. "1") pulse is illustrated by solid lines, while the first switch 120 and the second switch 122, that receive a low level (i.e. "0") pulse respectively, are illustrated by dotted lines.

When the second switch 122 next to the third switch 124 and the fourth switch 126 functions normally, the second switch 122 is turned off according to the pulse S2. No conducting loops are formed between the single phase branch 12 and the capacitor module 10, regardless of whether the first switch 120 functions normally or not. However, when a conducting loop LOOP5 is formed between the single phase branch 12 and the capacitor module 10, it means that the second switch 122 is defectively short-circuited.

As shown in FIG. 3B, the conducting loop LOOP5 is formed via the second switch 122, the third switch 124, the fourth switch 126, the capacitor C2 and the first diode D1. If the conducting loop LOOP5 is formed between the single phase branch 12 and the capacitor module 10, the second switch 122 of the conducting loop LOOP5 is determined to be short-circuited, since the detection sequence is supposed to make the loop open-circuited. Hence whether the second switch 122 is short-circuited can be determined according to the detection pulse sequence S1-S4 of "0011".

In FIG. 3C, the transmitted detection pulse sequence S1-S4 is "0110". Each of the second switch 122 and the third switch 124 that receives a high level (i.e. "1") pulse is illustrated by solid lines, while the first switch 120 and the fourth switch 126 that receive a low level (i.e. "0") pulse respectively, are illustrated by dotted lines.

When the first switch 120 and the fourth switch 126 next to the second switch 122 and the third switch 124 respectively function normally, the first switch 120 and the fourth switch 126 are turned off according to the pulses S1 and S4, and no conducting loop is formed. However, when a conducting loop LOOP6 is formed between the single phase branch 12 and the capacitor module 10, it means that the first switch 120 is defectively short-circuited.

As shown in FIG. 3C, the conducting loop LOOP6 is formed via the first switch 120, the second switch 122, the third switch 124, the capacitor C1 and the second diode D2. If the conducting loop LOOP6 is formed between the single phase branch 12 and the capacitor module 10, the first switch 120 of the conducting loop LOOP6 is determined to be short-circuited, since the detection sequence is supposed to make the loop open-circuited. Hence, whether the first switch 120 is short-circuited can be determined according to the detection pulse sequence S1-S4 of "0110".

In the present embodiment, when the detection pulse sequence S1-S4 is transmitted such that a conduction loop including the capacitor C2, the first diode D1, the second switch 122, the third switch 124 and the fourth switch 126 is formed, the fourth switch 126 is determined to be defectively short-circuited.

On the other hand, when the detection pulse sequence S1-S4 is transmitted such that a conduction loop including the first switch 120, the second switch 122, the third switch 124 and the fourth switch 126 is formed, the first switch 120 and the fourth switch 126 are both determined to be defectively short-circuited.

Reference is now made to FIG. 4A and FIG. 4B. FIG. 4A and FIG. 4B are circuit diagrams illustrating the capacitor module 10 and the single phase branch 12 according to another embodiment of the present disclosure.

In FIG. 4A and FIG. 4B, the purpose of the detection pulse sequence transmitted by the fault detection module 18 is to turn on three of the first switch 120, the second switch 122, the third switch 124 and the fourth switch 126, while keeping the rest one being turned off.

The fault detection module 18 can transmit the detection pulse sequence S1-S4 to the respective first to fourth switches 120-126 via respective control signal lines (not illustrated). If the control signal lines corresponding to the respective first switch 120 and second switch 122 neighboring to each other are reversely coupled to the second switch 122 and first switch 120 respectively, unintended short-circuit may occur.

For instance, in FIG. 4A, the transmitted detection pulse sequence S1-S4 is "1011". Each of the first switch 120, the third switch 124 and the fourth switch 126 that receives a high level (i.e. "1") pulse is illustrated by solid lines, while the second switch 122 that receives a low level (i.e. "0") pulse is illustrated by dotted lines.

When the control signal lines corresponding to the first switch 120 and the second switch 122 are not coupled reversely, there is no conducting loop being formed between the single phase branch 12 and the capacitor module 10. However, when a conducting loop LOOP7 is formed between the single phase branch 12 and the capacitor module 10, it means that the control signal lines corresponding to the respective first switch 120 and the second switch 122 are reversely coupled as shown in FIG. 4A, and the second switch 122 is short-circuited.

As shown in FIG. 4A, the conducting loop LOOP7 is formed via the capacitor C2, the first diode D1, the second switch 122, the third switch 124 and the fourth switch 126. If the conducting loop LOOP7 is formed between the single phase branch 12 and the capacitor module 10, the control signal lines corresponding to the respective first switch 120 and the second switch 122 can be determined to be reversely coupled. The conducting loop LOOP7 is formed due to the second switch 122 being turned on as the control signal line corresponding to the first switch 120 is reversely coupled to the second switch 122. Hence, whether the first switch 120 and the second switch 122 are short-circuited due to the corresponding control signal lines being reversely coupled can be determined according to the detection pulse sequence S1-S4 of "1011".

On the other hand, if the control signal lines corresponding to the third switch 124 and the fourth switch 126 are reversely coupled, unintended short-circuit can also occur.

For instance, in FIG. 4B, the transmitted detection pulse sequence S1-S4 is "1101". Each of the first switch 120, the second switch 122 and the fourth switch 126 that receives a high level (i.e. "1") pulse is illustrated by solid lines, while the third switch 124 that receives a low level (i.e. "0") pulse is illustrated by dotted lines.

When the control signal lines corresponding to the third switch 124 and the fourth switch 126 are not reversely coupled, there is no conducting loop being formed between the single phase branch 12 and the capacitor module 10. However, when the control signal lines corresponding to the respective third switch 124 and fourth switch 126 are reversely coupled as shown in FIG. 4B, the third switch 124 is short-circuited such that a conducting loop LOOP8 is formed between the single phase branch 12 and the capacitor module 10.

As shown in FIG. 4B, the conducting loop LOOP8 is formed via the capacitor C1, the first switch 120, the second switch 122, the third switch 124 and the second diode D2. If the conducting loop LOOP8 is formed between the single phase branch 12 and the capacitor module 10, the control signal lines corresponding to the respective third switch 124 and fourth switch 126 can be determined to be reversely coupled, so the conducting loop LOOP8 is formed due to the third switch 124 being turned on as the control signal line corresponding to the fourth switch 126 is reversely coupled to the third switch 124. Hence, whether the third switch 124 and the fourth switch 126 are short-circuited due to the corresponding signal lines being reversely coupled can be determined according to the detection pulse sequence S1-S4 of "1101".

Figures 5A, 5B:
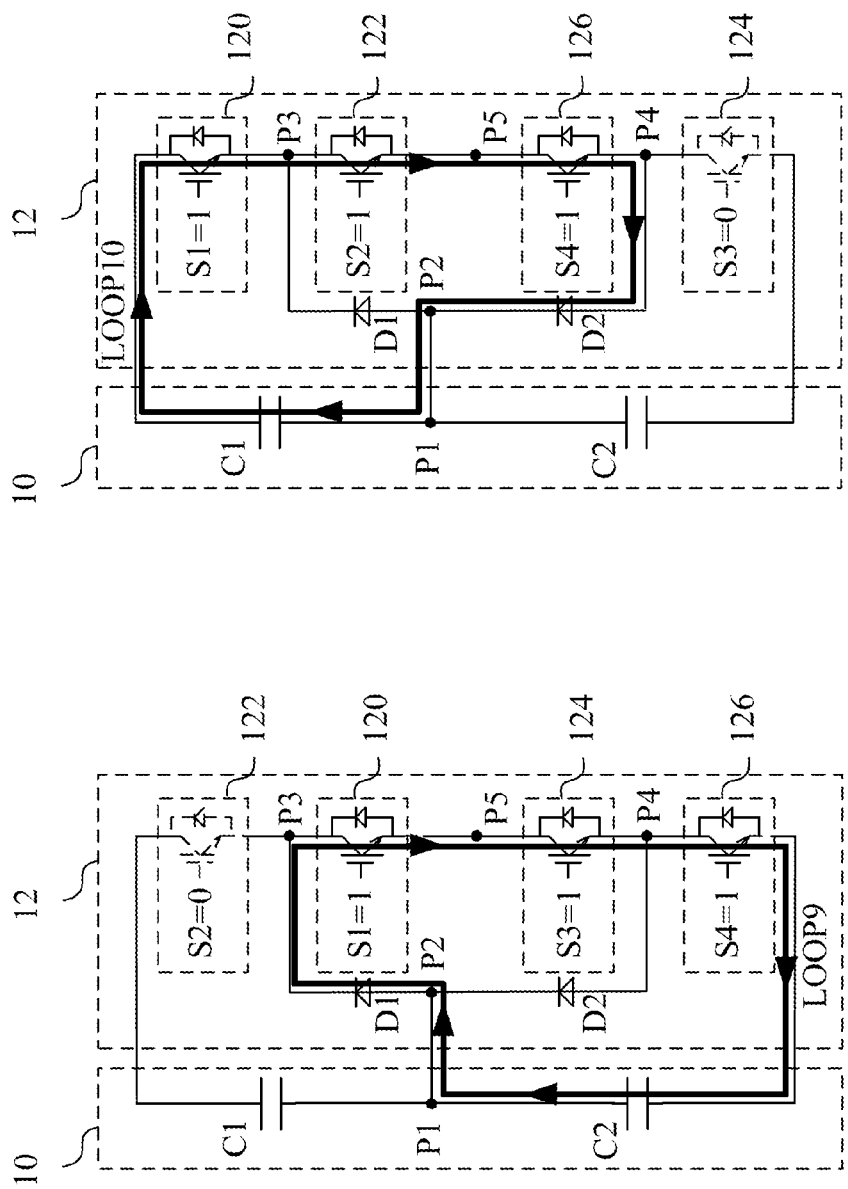
FIG. 5A and FIG. 5B are circuit diagrams illustrating a capacitor module and a single phase branch according to yet another embodiment of the present disclosure.

Reference is now made to FIG. 5A and FIG. 5B. FIG. 5A and FIG. 5B are circuit diagrams illustrating the capacitor module 10 and the single phase branch 12 according to another embodiment of the present disclosure.

The above detection pulse sequence can also be utilized to determine whether a physically reverse coupling condition of the first switch 120 and the second switch 122, or of the third switch 124 and the fourth switch 126 occurs.

For instance, in FIG. 5A, the transmitted detection pulse sequence S1-S4 is "1011". Each of the first switch 120, the third switch 124 and the fourth switch 126 that receives a high level (i.e. "1") pulse is illustrated by solid lines, while the second switch 122 that receives a low level (i.e. "0") pulse is illustrated by dotted lines.

When the first switch 120 and the second switch 122 are not reversely coupled, there is no conducting loop formed between the single phase branch 12 and the capacitor module 10. However, when a conducting loop LOOP9 is formed between the single phase branch 12 and the capacitor module 10, it means that the first switch 120 and the second switch 122 are reversely coupled as shown in FIG. 5A.

As shown in FIG. 5A, the conducting loop LOOP9 includes the second switch 122, the third switch 124, the fourth switch 126, the capacitor C2 and the first diode D1. If the conducting loop LOOP9 is formed between the single phase branch 12 and the capacitor module 10, the first switch 120 and the second switch 122 of the conducting loop LOOP9 can be determined to be physically and reversely coupled. The conducting loop LOOP9 is formed due to the second switch 122 being turned on as the control signal line corresponding to the first switch 120 is reversely coupled to the second switch 122. Hence, whether the first switch 120 and the second switch 122 are short-circuited due to being physically and reversely coupled can be determined according to the detection pulse sequence S1-S4 of "1011".

On the other hand, if the control signal lines corresponding to the third switch 124 and the fourth switch 126 neighboring to each other are coupled reversely, unintended short-circuit can also occur.

For instance, in FIG. 5B, the transmitted detection pulse sequence S1-S4 is "1101". Each of the first switch 120, the second switch 122 and the fourth switch 126 that receives a high level (i.e. "1") pulse is illustrated by solid lines, while the third switch 124 that receives a low level (i.e. "0") pulse is illustrated by dotted lines.

When the third switch 124 and the fourth switch 126 are not reversely coupled, there is no conducting loop formed between the single phase branch 12 and the capacitor module 10. However, when a conducting loop LOOP10 is formed between the single phase branch 12 and the capacitor module 10, it means that the third switch 124 and the fourth switch 126 are reversely coupled as shown in FIG. 5B.

As shown in FIG. 5B, the conducting loop LOOP10 is formed via the first switch 120, the second switch 122, the third switch 124, the capacitor C1 and the second diode D2. If the conducting loop LOOP10 is formed between the single phase branch 12 and the capacitor module 10, the third switch 124 and the fourth switch 126 of the conducting loop LOOP10 can be determined to be physically and reversely coupled. The conducting loop LOOP10 is formed due to the fourth switch 126 being turned on as the control signal line corresponding to the third switch 124 is reversely coupled to the fourth switch 126. Hence, whether the third switch 124 and the fourth switch 126 are short-circuited due to being physically and reversely coupled can be determined according to the detection pulse sequence S1-S4 of "1101".

In an embodiment, the fault detection module 18 sequentially transmits a multiple of detection pulse sequences to each of the single phase branches 12, 14 and 16, so as to determine whether the switches are defectively short-circuited. Further, in an embodiment, an order of the detection pulse sequences being transmitted is determined based on the number of switches intended to be turned on in a single phase branch, in which the detection pulse sequences corresponding to less number of switches intended to be turned on are transmitted first. For instance, the fault detection module 18 can determine short-circuits by sequentially transmitting 6 detection pulse sequences S1-S4 ("1000", "0100", "0010", "1100", "0011", "0110", "1011" and "1101") to the first to the fourth switches 120-126.

In an embodiment, the inverter circuit 1 which corresponds to three-phase AC (alternating current) power, includes three single phase branches, such as the single phase branches 12, 14 and 16 as shown in FIG. 1. The fault detection module 18 can sequentially transmit the detection pulse sequence S1-S4 mentioned above to each of the single phase branches 12, 14 and 16.

In an embodiment, the above-mentioned short-circuit detections can be initiated once a voltage of the bus that the capacitor module 10 is coupled to is charged to a predetermined value. In different embodiments, the short-circuit detections can be initiated when the inverter circuit 1 starts to operate, or during the operation of the inverter circuit 1. When at least one of the first to the fourth switches 120-126 is short-circuited or reversely coupled, the fault detection module 18 can perform a short-circuit protection process such as, but not limited to stop transmitting pulse signals that control the operation of the first to the fourth switches 120-126 to shut down the inverter circuit 1. In addition, the fault detection module 18 can generate a fault detection result analysis according to a result of the short-circuit detection.

Figure 6:
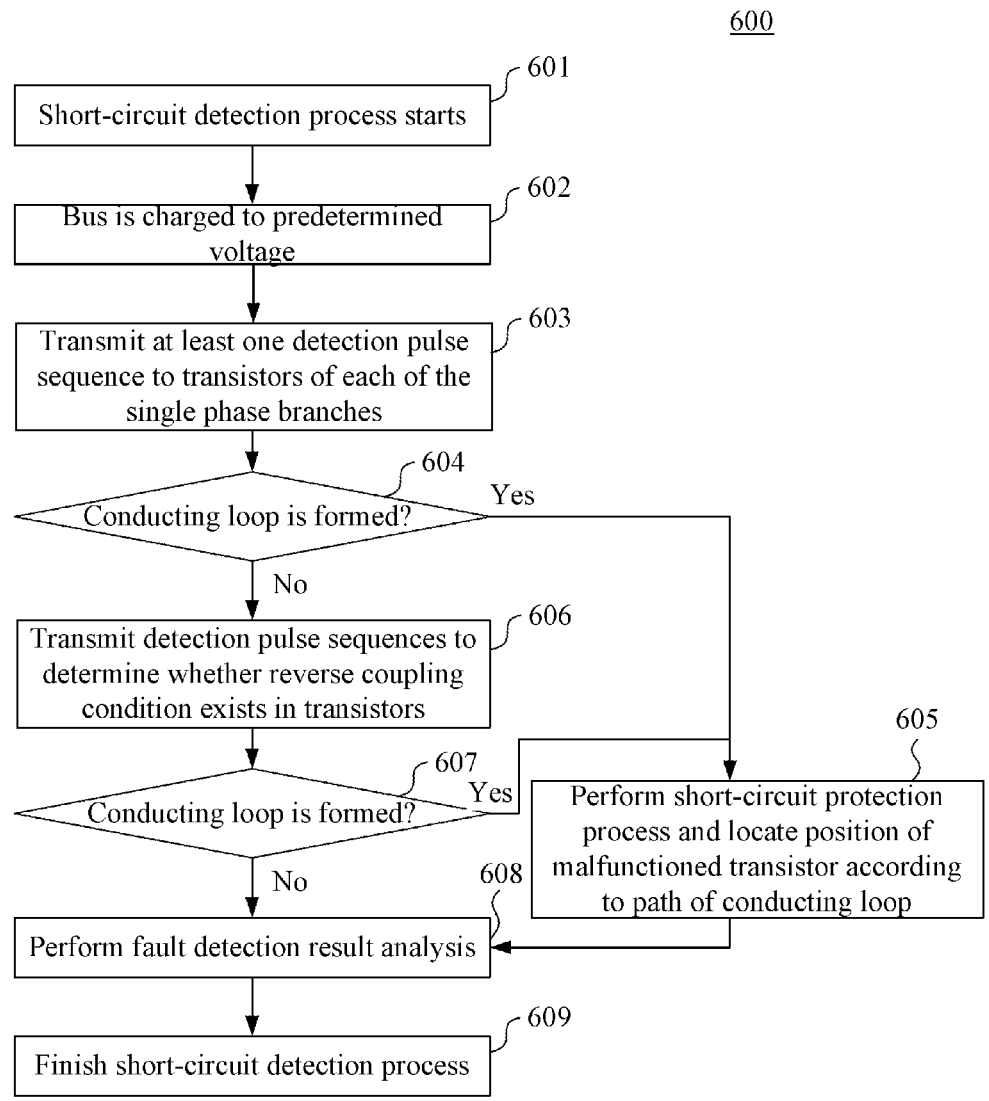
FIG. 6 is a flowchart illustrating a method for detecting a short circuit fault in a multi-level inverter circuit according to an embodiment of the present disclosure.

Reference is now made to FIG. 6. FIG. 6 is a flowchart illustrating a short-circuit detection method 600 for detecting a short circuit fault in the multi-level inverter circuit, such as the multi-level inverter circuit 1 illustrated in FIG. 1, according to an embodiment of the present disclosure. The method 600 includes the following steps (Unless specified otherwise, steps in the present embodiment can be performed in different orders according to practical needs. All steps, or a set of steps can even be performed at the same time, according to practical needs.)

In step 601, the short-circuit detection process starts.

In step 602, the bus is charged to a predetermined voltage.

In step 603, at least one detection pulse sequence is transmitted to switches of each of the single phase branches 12, 14 and 16.

In step 604, whether a conducting loop is formed in each of the single phase branches 12, 14 and 16 is determined.

When a conducting loop is formed, the fault detection module 18 performs short-circuit protection in step 605 and locates a position of a malfunctioned switch in each of the single phase branches 12, 14 and 16 according to a path of the conducting loop.

When there is no defective short-circuit, the detection pulse sequences are transmitted in the step 606 to determine whether the reverse coupling condition exists in between the first and the second switches 120, 122, or in between the third and the fourth switches 124, 126.

In step 607, whether any conducting loops is formed in each of the single phase branches 12, 14 and 16 can be determined according to the detection pulse sequences.

When a conducting loop is formed, the fault detection module 18 performs a short-circuit protection process in step 605 and determines a position of a malfunctioned switch in each of the single phase branches 12, 14 and 16 according to a path of the conducting loop.

When there are no defective short-circuits, or the fault detection module 18 has completed the short-circuit protection and has confirmed the position of the malfunctioning switch, the fault detection module 18 performs a fault detection result analysis in step 608 and the short-circuit detection process is finished in step 609.

Figure 7:
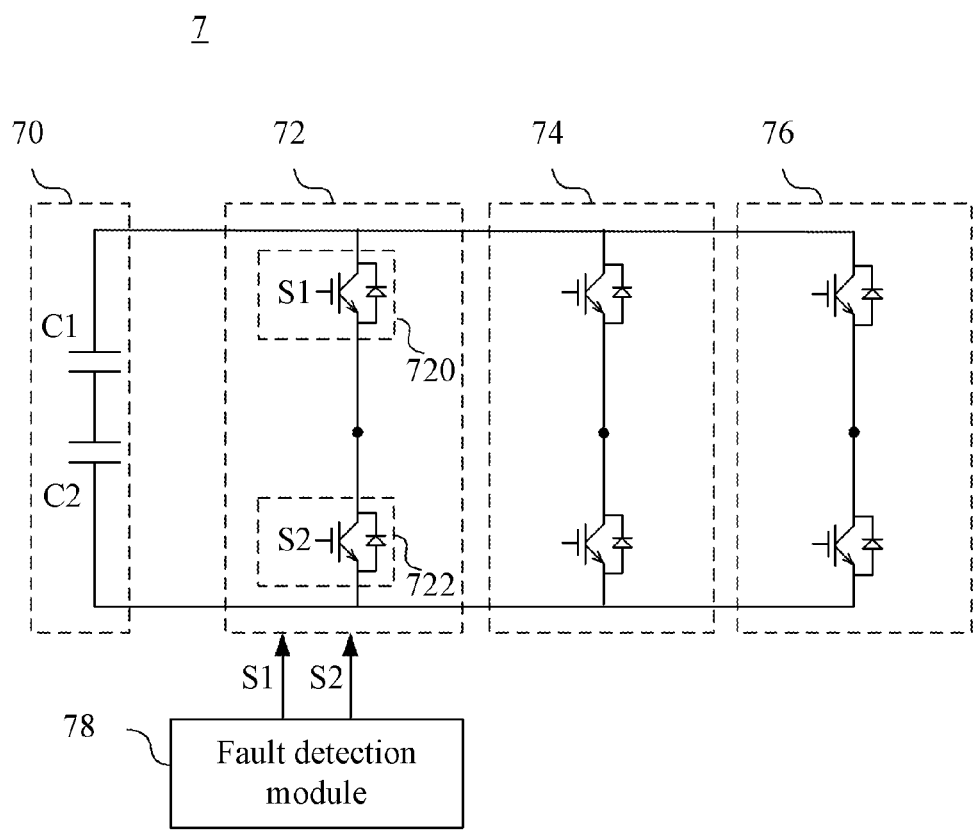
FIG. 7 is a circuit diagram illustrating an inverter circuit according to an embodiment of the present disclosure.

Reference is now made to FIG. 7. FIG. 7 is a circuit diagram illustrating an inverter circuit 7 according to an embodiment of the present disclosure. The inverter circuit 7 includes a capacitor module 70, single phase branches 72, 74 and 76, and a fault detection module 78.

The inverter circuit 7 can be a three-phase inverter circuit similar to the inverter circuit 1 as shown in FIG. 1. The inverter circuit 7 includes 3 single phase branches 72, 74 and 76 which are coupled to the capacitor module 70 in parallel. The inverter circuit 7 is different from the inverter circuit 1 in FIG. 1 in that the single phase branches 72, 74 and 76 of the inverter circuit 7 can be two-level inverters. In an embodiment, the single phase branches 72, 74 and 76 have the same structure and the detail structure of each of the single phase branch is described by using the single phase branch 72 as an example. The single phase branch 72 includes a first switch 720 and a second switch 722 coupled in series.

Similar to the inverter circuit 1, the inverter circuit 7 can transmit a detection pulse sequence S1-S2 to the first switch 720 and the second switch 722 of the single phase branch 72 via the fault detection module 78. For instance, the fault detection module 78 can transmit a detection pulse sequence S1-S2 of "01" and determine whether a conducting loop is formed in the single phase branch 72. When a conducting loop exists, the fault detection module 78 can determine a position of the defective short-circuit according to a switch corresponding to the "0" of the "01" of the detection pulse sequence S1-S2.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for detecting a short circuit fault in a multi-level inverter circuit, the multi-level inverter circuit comprising a plurality of single phase branches, each of which comprises a plurality of switches, the method comprising:
transmitting at least one detection pulse sequence to the plurality of switches of the single phase branch, wherein the at least one detection pulse sequence comprises a number of "0" and "1" pulses and the "0" and "1" pulses are transmitted to the switches respectively, wherein the "0" pulse represent a low level pulse and the "1" pulse represent a high level pulse;
determining whether a conducting loop is formed in the single phase branch according to the detection pulse sequence; and
locating a respective position of one or more malfunctioned switches according to a path of the conducting loop when the conducting loop exists, wherein a switch corresponding to the "0" pulse is determined as a short circuit fault, and after the switch corresponding to the "0" pulse is determined as the short circuit fault, a short-circuit protection process is performed to shut down the multi-level inverter circuit.

2. The method of claim 1, wherein the inverter circuit is a two-level converter, a three-level converter or a five-level converter.

3. The method of claim 2, wherein the inverter circuit is a three-phase two-level converter, which comprises a capacitor coupled to each of the plurality of single phase branches in parallel, and each of the plurality of single phase branches comprises a first switch and a second switch in series, the method comprising:
transmitting a detection pulse sequence of "01" to the first switch and the second switch of the single phase branch, wherein "0" represents a low level pulse transmitted to one of the first and second switch and "1" represents a high level pulse transmitted to the other of the first and second switch; and
locating a position of short-circuit fault of the single phase branch according to a switch corresponding to "0" of the detection pulse sequence of "01" when the conducting loop exists.

4. The method of claim 2, wherein the inverter circuit is a three-phase three-level converter, which comprises: a capacitor module comprising a first capacitor and a second capacitor electrically coupled in series via a first node, which is electrically coupled to each of the plurality of single phase branches in parallel; each of the plurality of single phase branches comprising: a first diode and a second diode electrically coupled in series between a third node and a fourth node via a second node, where the second node is electrically coupled to the first node;
a first switch and a second switch electrically coupled via the third node;
a third switch and a fourth switch electrically coupled via the fourth node, the second switch and the third switch electrically coupled via a fifth node, the method comprising:
transmitting the detection pulse sequence comprising a number of "0" and "1" pulses to the first switch, the second switch, the third switch and the fourth switch, wherein the "0" pulse represents a low level pulse and the "1" pulse represents a high level pulse;
locating a position and a number of at least one switch in the conducting loop according to the path of the conducting loop when the conducting loop exists;
matching the detection pulse sequence to the at least one switch in the conducting loop; and
locating the at least one switch corresponding to "0" pulse of the detection pulse sequence as short-circuit faulted according to a match result.

5. The method of claim 4, wherein when the detection pulse sequence is "0100" and the conducting loop exist, the single phase branch is defectively short-circuited in one of conditions below:
if the conducting loop comprises the second switch, the third switch and the fourth switch, the third switch and the fourth switch are defectively short-circuited;
if the conducting loop comprises the first switch, the second switch and the third switch, the first switch and the third switch are defectively short-circuited; and
if the conducting loop comprises the first switch, the second switch, the third switch and the fourth switch, the first switch, the third switch and the fourth switch are defectively short-circuited.

6. The method of claim 4, wherein when the detection pulse sequence is "0010" and the conducting loop exists, the single phase branch is defectively short-circuited in one of conditions below:
if the conducting loop comprises the first switch, the second switch and the third switch, the first switch and the second switch are defectively short-circuited;
if the conducting loop comprises the second switch, the third switch and the fourth switch, the second switch and the fourth switch are defectively short-circuited; and
if the conducting loop comprises the first switch, the second switch, the third switch and the fourth switch, the first switch, the second switch and the fourth switch are defectively short-circuited.

7. The method of claim 4, wherein when the detection pulse sequence is "0110" and the conducting loop exists, the single phase branch is defectively short-circuited in one of conditions below:
if the conducting loop comprises the first switch, the second switch and the third switch, the first switch is defectively short-circuited;
if the conducting loop comprises the second switch, the third switch and the fourth switch, the fourth switch is defectively short-circuited; and
if the conducting loop comprises the first switch, the second switch, the third switch and the third switch, the first switch and the fourth switch are defectively short-circuited.

8. The method of claim 4, wherein the short-circuit detection method comprises: sequentially transmitting a plurality of detection pulse sequences to the plurality of switches of each of the single phase branches, so as to check, in loops, whether the plurality of switches are defectively short-circuited.

9. The method of claim 8, wherein an order of the plurality of detection pulse sequences being transmitted is determined according to a number of switches intended to be turned on in the single phase branch, wherein the sequence of the plurality of detection pulse sequences that turn on a less number of switches are transmitted first.

10. The method of claim 4, wherein the detection pulse sequence is an optical fiber reverse coupling detection pulse, wherein:
when the detection pulse sequence is "1011" and the conducting loop exists, an optical fiber reverse coupling condition exists between the first switch and the second switch; and
when the detection pulse sequence is "1101" and the conducting loop exists, an optical fiber reverse coupling condition exists between the third switch and the fourth switch.

11. The method of claim 1, wherein the short-circuit detection method further comprises:
determining whether the conducting loop exists in the single phase branch, according to the detection pulse sequence and a hardware short-circuit protection mechanism.

12. A device for detecting a short circuit fault in a multi-level inverter circuit, the inverter circuit comprising a plurality of single phase branches, each of which comprises a plurality of switches, the device comprising:
a pulse transmitting module for transmitting at least one detection pulse sequence to the plurality of switches of the single phase branch, wherein the at least one detection pulse sequence comprises a number of "0" and "1" pulses and the "0" and "1" pulses are transmitted to the switches respectively, wherein the "0" pulse represent a low level pulse and the "1" pulse represent a high level pulse;
a loop determining module for determining whether a conducting loop is formed in the single phase branch according to the detection pulse sequence; and
a fault detection module for locating a position of a malfunctioned switch of the single phase branch according to a path of the conducting loop when the conducting loop exists,
wherein a switch corresponding to the "0" pulse is determined as a short circuit fault, and after the switch corresponding to the "0" pulse is determined as the short circuit fault, a short-circuit protection process is performed to shut down the multi-level inverter circuit.

13. The device of claim 12, wherein the inverter circuit is a two-level converter, a three-level converter or a five-level converter.

14. The device of claim 13, wherein the inverter circuit is a three-phase two-level converter comprising a capacitor which is coupled to each of the plurality of single phase branches in parallel, each of the plurality of single phase branches comprises a first switch and a second switch which are coupled in series, the pulse transmitting module transmits a detection pulse sequence of "01" to the first switch and the second switch, wherein "0" represents a low level pulse transmitted to one of the first and second switch and "1" represents a high level pulse transmitted to the other of the first and second switch, and the fault detection module locates the position of one or more defective short-circuit switches of the single phase branch according to a switch corresponding to "0" of the detection pulse sequence of "01", when the conducting loop exists in the single phase branch.

15. The device of claim 13, wherein the inverter circuit is a three-phase three-level converter, the inverter circuit comprises:
a capacitor module comprising a first capacitor and a second capacitor electrically coupled in series via a first node, and the capacitor module is electrically coupled to each of the plurality of single phase branches in parallel;
each of the plurality of single phase branches comprising:
a first diode and a second diode electrically coupled in series between a third node and a fourth node via a second node, wherein the second node is electrically coupled to the first node;
a first switch and a second switch electrically coupled via the third node;
a third switch and a fourth switch electrically coupled via the fourth node, the second switch and the third switch electrically coupled via a fifth node,
wherein the pulse transmitting module transmits the detection pulse sequence comprising of a number of "0" and "1" pulses to the first switch, the second switch, the third switch and the fourth switch, wherein the "0" pulses represent a low level pulse and the "1" pulses represent a high level pulse;
the fault detection module determines the position and a number of at least one switch in the conducting loop according to the path of the conducting loop when the conducting loop exists in the single phase branch, the fault detection module matches the detection pulse sequence to the at least one switch in the conducting loop, and determines the at least one switch corresponding to "0" pulse of the detection pulse sequence as defectively short-circuited according to a match result.

16. The device of claim 12, wherein the loop determining module determines whether the conducting loop exists in the single phase branch according to the detection pulse sequence and a hardware short-circuit protection mechanism.

17. A three-phase three-level inverter circuit, comprising:
a capacitor module, comprising a first capacitor and a second capacitor electrically coupled in series via a first node;
three single-phase branches, each single-phase branch coupling to the capacitor module in parallel, each single phase branch comprising:
a first diode and a second diode electrically coupled in series between a third node and a fourth node via a second node, wherein the second node is electrically coupled to the first node;
a first switch and a second switch electrically coupled via the third node; and
a third switch and a fourth switch electrically coupled via the fourth node, wherein the second switch and the third switch are electrically coupled via a fifth node; and
a fault detection module for transmitting a detection pulse sequence comprising a number of "0" and "1" pulses to the first switch, the second switch, the third switch and the fourth switch, wherein the "0" pulse represent a low level pulse and the "1" pulse represent a high level pulses, in the single-phase branch, the fault detection module determining whether a conducting loop exists in the single-phase branch according to the detection pulse sequence, and for locating a position of one or more defective short-circuit switches in the single-phase branch according to a path of the conducting loop when the conducting loop exists in the single phase branch.

18. The three-phase three-level inverter circuit of claim 17, wherein the fault detection module determines the position and a number of at least one switch in the conducting loop according to the path of the conducting loop, the fault detection module then matches the detection pulse sequence to the at least one switch in the conducting loop, and determines the at least one switch corresponding to "0" pulse of the detection pulse sequence as defectively short-circuited according to a matching result.

19. The three-phase three-level inverter circuit of claim 17, wherein when the detection pulse sequence is "0100" and the conducting loop exists, the single phase branch is defectively short-circuited in one of conditions below:
   if the conducting loop comprises the second switch, the third switch and the fourth switch, the third switch and the fourth switch are defectively short-circuited;
   if the conducting loop comprises the first switch, the second switch and the third switch, the first switch and the third switch are defectively short-circuited; and
   if the conducting loop comprises the first switch, the second switch, the third switch and the fourth switch, the first switch, the third switch and the fourth switch are defectively short-circuited.

20. The three-phase three-level inverter circuit of claim 17, wherein when the detection pulse sequence is "0010" and the conducting loop exists, the single phase branch is defectively short-circuited in one of conditions below:
   if the conducting loop comprises the first switch, the second switch and the third switch, the first switch and the second switch are defectively short-circuited;
   if the conducting loop comprises the second switch, the third switch and the fourth switch, the second switch and the fourth switch are defectively short-circuited; and
   if the conducting loop comprises the first switch, the second switch, the third switch and the fourth switch, the first switch, the second switch and the fourth switch are defectively short-circuited.

21. The three-phase three-level inverter circuit of claim 17, wherein when the detection pulse sequence is "0110" and the conducting loop exists, the single phase branch is defectively short-circuited in one of conditions below:
   if the conducting loop comprises the first switch, the second switch and the third switch, the first switch is defectively short-circuited;
   if the conducting loop comprises the second switch, the third switch and the fourth switch, the fourth switch is defectively short-circuited; and
   if the conducting loop comprises the first switch, the second switch, the third switch and the fourth switch, the first switch and the fourth switch are defectively short-circuited.

22. The three-phase three-level inverter circuit of claim 17, wherein the fault detection module sequentially transmits a plurality of detection pulse sequences to switches of each of the single phase branches, so as to check whether the switches are defectively short-circuited.

23. The three-phase three-level inverter circuit of claim 17, wherein an order of the plurality of detection pulse sequences being transmitted is determined according to a number of switches intended to be turned on in the single phase branch, wherein the sequence of the plurality of detection pulse sequences that turn on a less number of switches are transmitted first.

24. The three-phase three-level inverter circuit of claim 17, wherein the detection pulse sequence is an optical reverse coupling detection pulse,
   when the detection pulse sequence is "1011" and the conducting loop exists, an optical fiber reverse coupling condition exists between the first switch and the second switch; and
   when the detection pulse sequence is "1101" and the conducting loop exists, an optical fiber reverse coupling condition exists between the third switch and the fourth switch.

* * * * *